US010546634B2

(12) United States Patent
Zeng et al.

(10) Patent No.: US 10,546,634 B2
(45) Date of Patent: *Jan. 28, 2020

(54) CROSS POINT MEMORY CONTROL

(71) Applicant: Intel Corporation, Santa Clara, CA (US)

(72) Inventors: Raymond W. Zeng, Sunnyvale, CA (US); Mase J. Taub, Folsom, CA (US); Kiran Pangal, Fremont, CA (US); Sandeep K. Guliani, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,441

(22) Filed: Sep. 24, 2018

(65) Prior Publication Data

US 2019/0096482 A1 Mar. 28, 2019

Related U.S. Application Data

(63) Continuation of application No. 15/465,470, filed on Mar. 21, 2017, now Pat. No. 10,134,468, which is a
(Continued)

(51) Int. Cl.
*G11C 13/00* (2006.01)
*G11C 8/06* (2006.01)
(Continued)

(52) U.S. Cl.
CPC ............ *G11C 13/0028* (2013.01); *G11C 8/06* (2013.01); *G11C 13/003* (2013.01); *G11C 13/004* (2013.01); *G11C 13/0004* (2013.01); *G11C 13/0007* (2013.01); *G11C 13/0021* (2013.01); *G11C 13/0023* (2013.01); *G11C 13/0026* (2013.01); *G11C 13/0033* (2013.01); *G11C 13/0061* (2013.01); *G11C 13/0069* (2013.01); *G11C 13/0097* (2013.01);
(Continued)

(58) Field of Classification Search
None
See application file for complete search history.

(56) References Cited

U.S. PATENT DOCUMENTS 5,373,475 A   12/1994   Nagase
5,627,784 A   5/1997   Roohparvar
(Continued)

OTHER PUBLICATIONS

First Office Action for U.S. Appl. No. 14/853,246, dated May 11, 2016, 8 pages.
(Continued)

*Primary Examiner* — Tan T. Nguyen
(74) *Attorney, Agent, or Firm* — Compass IP Law PC

(57) ABSTRACT

The present disclosure relates to phase change memory control. An apparatus includes a memory controller. The memory controller includes a word line (WL) control module and a bit line (BL) control module. The memory controller is to determine a WL address based, at least in part, on a received memory address. The memory controller is further to determine a BL address. The apparatus further includes a parameter selection module to select a value of a control parameter based, at least in part, on at least one of the WL address and/or the BL address.

36 Claims, 3 Drawing Sheets

Related U.S. Application Data continuation of application No. 14/853,246, filed on Sep. 14, 2015, now Pat. No. 9,601,193.

(51) Int. Cl.
*G11C 16/08* (2006.01)
*G11C 16/34* (2006.01)

(52) U.S. Cl.
CPC .......... *G11C 16/08* (2013.01); *G11C 16/3418* (2013.01); *G11C 2013/0052* (2013.01); *G11C 2013/0092* (2013.01)

(56) References Cited

U.S. PATENT DOCUMENTS

| | | |
|---|---|---|
| 5,636,164 A | 6/1997 | As et al. |
| 6,073,204 A | 6/2000 | Lakhani et al. |
| 6,282,134 B1 | 8/2001 | Kumar |
| 6,334,174 B1 | 12/2001 | Delp et al. |
| 6,374,323 B1 | 4/2002 | Stracovsky et al. |
| 7,552,273 B2 | 6/2009 | Otterstedt et al. |
| 7,903,462 B1 | 3/2011 | Yeung et al. |
| 8,225,031 B2 | 7/2012 | Lee et al. |
| 8,391,048 B2 | 3/2013 | Ichihara et al. |
| 9,601,193 B1 | 3/2017 | Zeng et al. |
| 2001/0010653 A1 | 8/2001 | Wakasugi et al. |
| 2004/0233709 A1 | 11/2004 | Tsuchida et al. |
| 2004/0243753 A1 | 12/2004 | Horowitz et al. |
| 2007/0076464 A1* | 4/2007 | Koebernick ....... G11C 16/0475 365/100 |
| 2007/0195590 A1 | 8/2007 | Sugita |
| 2008/0043522 A1 | 2/2008 | Fuji et al. |
| 2008/0205120 A1* | 8/2008 | Sung ................ G11C 11/404 365/149 |
| 2009/0219750 A1 | 9/2009 | Tokiwa et al. |
| 2010/0332729 A1 | 12/2010 | Alrod et al. |
| 2011/0032745 A1 | 2/2011 | Ichihara et al. |
| 2011/0188289 A1 | 8/2011 | Chevallier et al. |
| 2011/0305079 A1* | 12/2011 | Park ................ G11C 16/10 365/185.2 |
| 2012/0036315 A1 | 2/2012 | Reohr et al. |
| 2012/0257455 A1* | 10/2012 | Oh ................ G11C 16/10 365/185.22 |
| 2012/0314477 A1 | 12/2012 | Siau |
| 2013/0051120 A1* | 2/2013 | Oh ................ G11C 13/0004 365/148 |
| 2013/0135919 A1 | 5/2013 | Hamada |
| 2013/0223143 A1* | 8/2013 | Cho ................ G11C 16/0483 365/185.03 |
| 2013/0250690 A1* | 9/2013 | Lai ................ G11C 11/5628 365/185.17 |
| 2014/0009997 A1 | 1/2014 | Toda |
| 2014/0029334 A1* | 1/2014 | Katti ................ G11C 11/16 365/158 |
| 2014/0043887 A1* | 2/2014 | Lym ................ G11C 13/0069 365/148 |
| 2014/0126268 A1 | 5/2014 | Katayama et al. |
| 2014/0146607 A1 | 5/2014 | Nagai et al. |
| 2015/0062999 A1 | 3/2015 | Kang et al. |
| 2015/0085584 A1* | 3/2015 | Choi ................ G11C 16/26 365/185.21 |
| 2015/0155048 A1 | 6/2015 | Jeong et al. |
| 2015/0221351 A1* | 8/2015 | Park ................ G11C 8/08 365/51 |
| 2015/0255166 A1* | 9/2015 | Tseng ................ G11C 16/28 365/185.17 |
| 2015/0348637 A1* | 12/2015 | Han ................ G11C 16/16 365/185.2 |

OTHER PUBLICATIONS

First Office Action for U.S. Appl. No. 15/465,470, dated Sep. 13, 2017, 9 pages.
International Preliminary Report on Patentability and Written Opinion issued in PCT Application No. PCT/US2016/046135, dated Mar. 29, 2018, 8 pages.
International Search Report and Written Opinion for PCT Application No. PCT/US2016/046135, dated Dec. 2, 2016.
Notice of Allowance for U.S. Appl. No. 14/853,246, dated Nov. 15, 2016, 9 pages.
Second Office Action for U.S. Appl. No. 14/853,246, dated Jun. 28, 2016, 11 pages.
Second Office Action for U.S. Appl. No. 15/465,470, dated Mar. 1, 2018, 6 pages.
Extended European Search Report for Patent Application No. 16847014.4, dated Mar. 18, 2019, 11 pages.
Extended European Search Report for Patent Application No. 18214236.4, dated Mar. 18, 2019, 12 pages.

* cited by examiner

CROSS POINT MEMORY CONTROL

CROSS-REFERENCE TO RELATED APPLICATION

The present application is a continuation of U.S. patent application Ser. No. 15/465,470 filed Mar. 21, 2017, which is a continuation of U.S. patent application Ser. No. 14/853,246 filed Sep. 14, 2015 (now U.S. Pat. No. 9,601,193), the entire disclosure of which is incorporated herein by reference.

FIELD

The present disclosure relates to memory control.

BACKGROUND

Cross point memory, e.g., three dimensional (3D) cross point technology, is a memory device which typically uses a chalcogenide material for the memory elements. A memory element is the unit that actually stores information. In operation, the cross point, e.g., phase change, memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory cells may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

In a read operation, the differential bias voltage across the memory cell is configured to be greater than a maximum set voltage and less than a minimum reset voltage for the memory cell. In response, the target memory cell may or may not "snap back", depending on whether the memory element is in the crystalline state (set) or the amorphous state (reset). Snap back is a property of the composite memory element that results in an abrupt (e.g., on the order of tens of picoseconds) increase in conductivity (and corresponding decrease in resistance) of the memory element. Sense circuitry, coupled to the memory cell, is configured to detect the presence or absence of snap back in a sensing time interval. The presence of snap back in a sensing interval may then be interpreted as a logic one and the absence of snap back during the sensing interval as a logic zero.

During a programming operation, the differential bias voltage may be maintained across the memory cell for a first time period sufficient to cause the memory element to snap back. Current through the memory element may then be controlled for a second time period to transition the memory element from the amorphous state to the crystalline state or from the crystalline state to the amorphous state.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
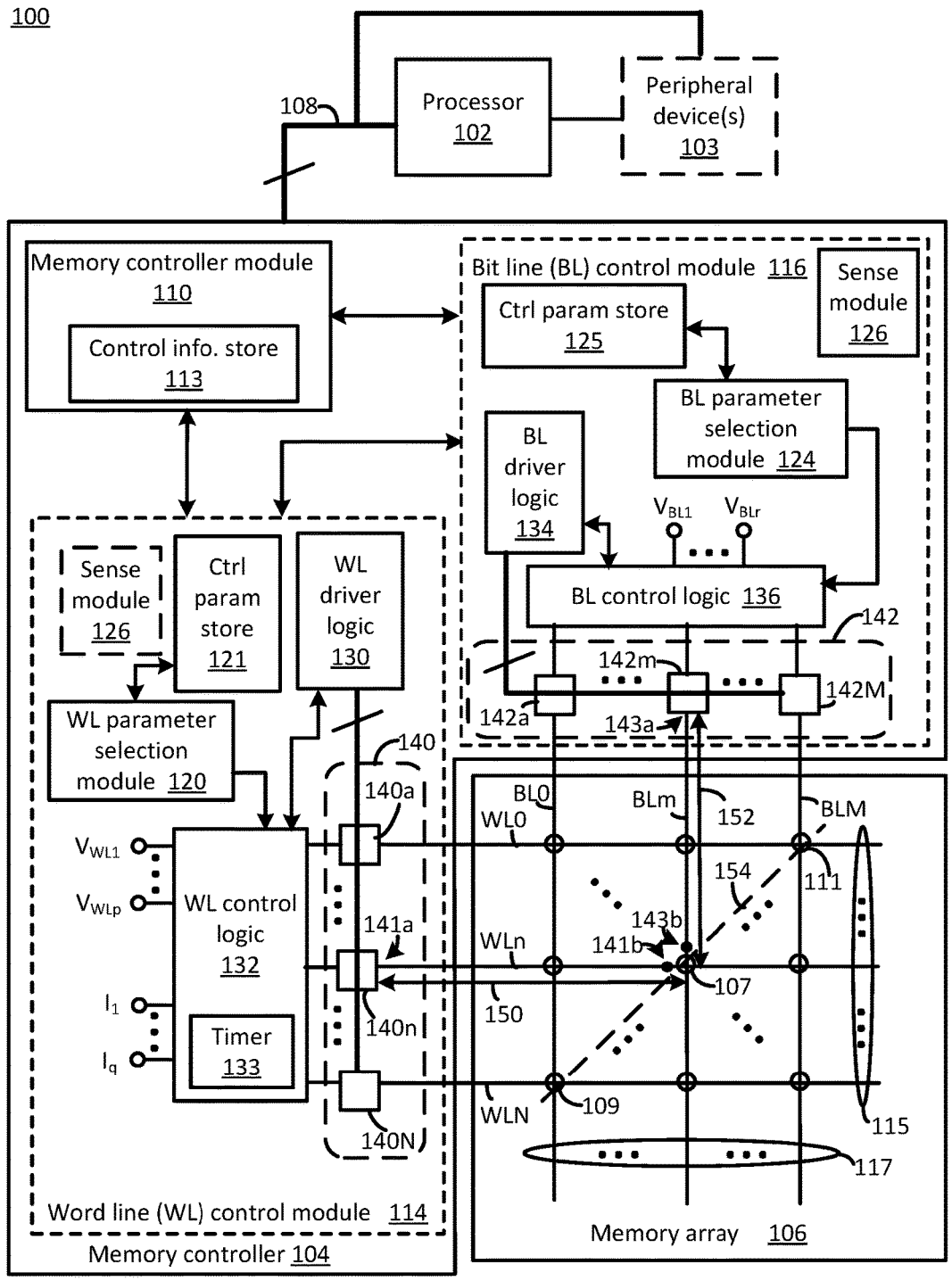
FIG. 1 illustrates a system block diagram, consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

In a memory access operation, a target memory cell may be selected, read and/or programmed (i.e., written to) by applying respective voltages to the WL and BL that cross at the target memory cell and then applying one or more currents to the WL or BL. The BL and WL may each correspond to a transmission line that has a distributed impedance (i.e., impedance per unit length). The distributed impedance includes a distributed resistance (i.e., resistance per unit length) and a distributed capacitance (i.e., capacitance per unit length). An effective impedance of the WL as seen by the target memory cell is related to a WL path length and the distributed impedance of the WL. Similarly, an effective impedance of the BL as seen by the target memory cell is related to a BL path length and the distributed impedance of the BL. A WL path corresponds to a portion of the WL between a supply location of the WL and the target memory cell. A BL path corresponds to a portion of the BL between a supply location of the BL and the target memory cell. As used herein, supply location is a location on a WL (or a BL) that is coupled to an output port of a switch, the switch configured to controllably couple a selected WL (or BL) to a voltage and/or current source.

Thus, for a given WL source voltage VWL, a given BL source voltage VBL and a given source current I, a resulting differential voltage VCELL at a target memory cell and a resulting current ICELL through the target memory cell may vary based, at least in part, on the WL path length and based, at least in part, on the BL path length associated with the target memory cell.

A duration of a time interval (i.e., time delay) between application of VWL to the supply location of the WL and/or application of VBL to the supply location of the BL and VCELL achieving a steady state value at the target memory cell is related to time constants (i.e., RC time constant) associated with the WL path and BL path. Each time constant is related to the distributed resistance, distributed capacitance and the path length of the respective WL and BL. The time delay may affect a duration of a time interval associated with selecting a memory cell, a duration of a time interval associated with performing a memory access operation (e.g., reading from and/or writing to the memory cell) and/or a duration of a sensing interval. For example, a duration of a memory read operation may be on the order of 10 nanoseconds (ns). In another example, a duration of a memory write operation may be on the order of 100 ns. A difference between time constants for memory cells relatively near the WL and BL supply locations and memory cells relatively distant from the WL and BL supply locations is about 5 to 10 ns. Thus, the time delay may affect memory access time(s), i.e., memory access latency.

One or more memory cell operational parameters, as described herein, may vary across an array of memory cells. For example, a hold current, Ihold, may vary across an array of memory cells. Ihold corresponds to a minimum current through a memory cell configured to maintain the memory cell in an ON state. In other words, value(s) of memory cell operational parameter(s), e.g., Ihold, associated with a target memory cell may be related to a WL address and/or a BL address associated with the target memory cell.

Generally, this disclosure describes an apparatus, system and method configured to select a value of at least one control parameter based, at least in part, on an address associated with a target memory cell in a three dimensional cross point memory. A three dimensional cross point memory includes phase change memory and corresponds to a layered array of memory cells that may also include a control layer. Each layer may include an array of memory cells. Value(s) of each control parameter may be determined prior to operation and selected during operation or may be determined and selected during operation. In a cross point memory, the WL path length is related to a target BL address and the BL path length is related to a target WL address. Selecting control parameter value(s) based, at least in part, on a target WL address and/or a target BL address associated with the target memory cell is configured to accommodate variation in effective impedance with path length and/or variation in memory cell operational parameter(s), e.g., Ihold, with location, as will be described in more detail below.

One or more control parameter value(s) may be determined for each control parameter, a priori. A priori determination of one or more control parameter values may include, for example, determination of the one or more parameter values prior to providing signals to the memory array 106, prior to, during, or after the manufacture of the memory array 106 and/or memory controller 104, etc. Each control parameter value may be related to one or more WL address(es) and/or one or more BL address(es). The control parameter value(s) may be associated with corresponding WL address(es) and/or BL address(es) and stored in a look up table (LUT). During operation, the stored control parameter value(s) may be selected from the LUT based, at least in part, on a target WL address and/or a target BL address.

As used herein, control parameters include source voltages, source current amplitude(s), selection time interval duration, sensing time interval duration and source pulse (e.g., programming current pulse) durations. A programming current pulse may be a set pulse (i.e., configured to write a logic one to a selected memory cell) or a reset pulse (i.e., configured to write a logic zero to a selected memory cell). A reset pulse has an associated reset pulse amplitude and reset pulse duration and a set pulse has an associated set pulse amplitude and set pulse duration.

Amplitudes of current pulses through a target memory cell and time duration of the pulses may affect how well a memory cell sets and resets. For example, a target memory cell may be selected with a relatively low current that is greater than the minimum current, Ihold, configured to maintain the memory cell in the ON state. In another example, a memory cell may be reset by applying a pulse with a relatively high current amplitude for a relatively short pulse duration. In another example, a memory cell may be set by applying a range of intermediate current amplitudes for a relatively longer set pulse duration.

Value(s) of one or more control parameter(s) configured to implement memory access operations may be selected based, at least in part, on nominal values and distributions of one or more memory cell operational parameters. Memory cell operational parameters associated with each memory cell included in a memory array may vary over the memory array. Memory cell operational parameters include memory cell selection threshold voltage(s), hold current (Ihold) amplitude, set and reset programming current amplitude(s) and set and reset programming pulse duration(s). For example, each memory cell operational parameter may be described by a distribution that includes an associated nominal value and a range of values bounded by a maximum value and a minimum value for at least a portion of the memory array.

The apparatus, system and method, in at least one embodiment, are configured to accommodate losses and non-zero time constants of WLs and BLs that vary with WL path length and BL path length. The apparatus, system and method may be further configured to accommodate variation in memory cell operational parameters, e.g., Ihold, with memory cell location.

The apparatus, system and method are configured to provide one or more source voltage values and one or more source current values to a memory array. The source voltage(s) and/or source current(s) may be coupled to a target WL and/or target BL at respective supply locations. For example, the supply location may correspond to a first end of the respective WL and/or BL. In another example, the supply location may correspond to a location along the WL and/or BL. For example, the supply location may be centered between the first end and a second end of the respective WL and/or BL. Centering the supply location is configured to reduce and/or minimize the effective resistances seen by the target memory cell.

The apparatus, system and method in at least one embodiment are configured to reduce energy consumption by providing a differential voltage VCELL at a memory cell and a cell current ICELL through the memory cell that are relatively closer to nominal operating values. The apparatus, system and method in at least one embodiment are configured to reduce memory access latency over a memory array by reducing current pulse duration for memory cells relatively closer to the source locations of the target WL and target BL compared to relatively more distant memory cells. The apparatus, system and method may further reduce memory access errors by providing a VCELL and/or ICELL relatively closer to nominal values for a relatively greater portion of a memory array compared to providing a "worst case" relatively large VCELL and/or ICELL over an entire memory array. The apparatus, system and method may be further configured to supply an ICELL value that corresponds to Ihold based, at least in part, on target WL address and/or target BL address.

FIG. 1 illustrates a system block diagram 100 consistent with several embodiments of the present disclosure. The system 100 includes a processor 102, a memory controller 104 and a memory array 106. The system 100 may include one or more peripheral device(s) 103. The processor 102 is coupled to the memory controller 104 by bus 108. Processor 102 may provide memory access request(s) (i.e., read and/or write request(s)) including memory address(es), and/or associated data to memory controller 104 and may receive read data from memory controller 104. Peripheral device(s) 103 may include, but are not limited to, user interface device(s) (e.g., display, keyboard, touchscreen, mouse, touch pad, etc.), wired and/or wireless communication device(s) (e.g., transmitter, receiver, etc.), storage device(s) (e.g., hard disk drives, removable storage media, external memory, solid state drives, etc.), etc. It should be noted that system 100 is simplified for ease of illustration and description. Memory array 106 may correspond to at least a portion of a crosspoint memory and may include one or more tile(s), i.e., memory array sub-block(s). Memory array 106 includes a plurality of WLs 115, a plurality of BLs 117 and a plurality of memory cells, e.g., memory cells 107, 109, 111. The plurality of WLs 115 includes N+1 WLs, e.g., WL0, . . . , WLn, . . . , and WLN. The plurality of BLs 117 includes M+1 BLs, e.g., BL0, . . . , BLm, . . . , and BLM. In some embodiments the memory sub-blocks may be stacked. For example, the plurality of WLs 115, plurality of BLs 117 and plurality of memory cells may then correspond to one layer of memory array 106.

Each memory cell is coupled between a WL and a bit line BL at a cross point of the WL and the BL. For example, memory cell 107 is coupled between WLn and BLm at a cross point of WLn and BLm. Each memory cell includes a memory element configured to store information and may include a memory cell select device coupled to the memory element. Select devices may include ovonic threshold switches, diodes, bipolar junction transistors, field-effect transistors, etc. Memory array 106 is configured to store binary data and may be written to (i.e., programmed) or read from.

Each WL WL0, . . . , WLn, . . . , WLN may be identified by a respective WL address and each BL BL0, . . . , BLm, . . . , BLM may be identified by a respective BL address. A location of a memory cell may then be identified by the addresses of the WL and BL that cross at that memory cell, e.g., the addresses of WL WLn and BL BLm for memory cell 107.

One or more value(s) of each of one or more of the control parameters may be determined a priori, as described herein. For example, peripheral device(s) 103, processor 102 and memory controller 104 may be configured to facilitate determining the control parameter values. For example, control parameter values may be determined based, at least in part, on one or more value(s) of one or more memory cell operational parameter(s) associated with one or more memory cells of memory array 106. For example, the memory cell operational parameter value(s) may be determined experimentally. In another example, the control parameter values may be determined based, at least in part, on one or more properties of the WLs and BLs in memory array 106. The properties may include, for example, distributed impedances that may be related to material properties. In another example, the value(s) of the control parameter(s) may be set by a user via peripheral device(s) 103.

For example, WL and/or BL source voltages may be determined based, at least in part, on achieving a target memory cell current. The source voltages are configured to select a target memory cell while avoiding false selection of non-target memory cells. In another example, source current amplitude and pulse duration may be determined based, at least in part, on read and/or programming accuracy of the target memory cell while avoiding disturbing non target memory cells.

Control parameter values may then be associated with one or more memory cell(s) by relating each control parameter value to one or more WL address(es) and/or one or more BL address(es). For example, control parameter values may be related to WL address(es) and/or BL address(es) by a user via peripheral device(s) 103. In another example, control parameter values may be related to WL address(es) and/or BL address(es) by memory controller 104.

A plurality of memory cells may be combined in a group. Each group may be configured to include memory cell(s) that have one or more associated memory cell operational parameter value(s) within a respective defined range of values. For example, associated memory cell operational parameters may include memory cell selection and/or threshold voltage(s), Ihold, set and/or reset current pulse amplitude and/or durations. Each group of memory cells may then correspond to a portion, e.g., a region, of memory cell array 106. A number of regions and region boundaries may be determined a priori and boundary information may be stored. One or more of peripheral device(s) 103 may be configured to facilitate determining the number of regions and the associated region boundaries. For example, the number of regions and their associated region boundaries may be determined based, at least in part, on measurements of memory array 106. The measurements may include memory cell operational parameter(s) and/or distributed impedances of one or more WLs and/or one or more BLs. In another example, the number of regions and associated region boundaries may be set by a user.

A number of memory cell regions and/or region boundaries may be related to supply locations for voltage and current sources. In a first example, supply locations may correspond to respective first ends of WLs and/or BLs, as described herein. In a second example, supply locations may correspond to locations, e.g., centered, along the WLs and BLs. Continuing with this second example, WL source voltage(s) and/or source current(s) may be coupled to WLs 115 at or near BLm and BL source voltages may be coupled to BLs 117 at or near WLn. Index m may then be M/2 and index n may then be N/2.

In an embodiment, region boundaries may correspond to WL(s) and/or BL(s). For example, a first region may be bounded by BL0, BLm, WL0 and WLn, a second region may be bounded by BLm, BLM, WL0 and WLn, etc. In this example, the number of regions is four. A location of a target memory cell may be determined and identification of the region that includes the memory cell may be identified based, at least in part, on the BL address and WL address of the BL and WL that cross at the target memory cell and based, at least in part, on the region boundaries. Control parameter values may then be selected based, at least in part, on the identified region.

In another embodiment, region boundaries may be defined by one or more function(s) that relate BL and WL addresses and/or by a BL address and/or a WL address. For example, for supply locations at first ends of WLs 115 and BLs 117, a first region may be bounded by BL0, WL0 and a line 154 that passes through memory cells 109, 107 and 111 and a second region may be bounded by the line 154, BLM and WLN. In this example, a function that corresponds to line 154 may be determined as $y=-(N/M)x+N$ where M and N are indices corresponding to BLM and WLN, respectively. Indices corresponding to WL0 and BL0 are 0 and 0 and index corresponding to WLn is n and the index corresponding to BLM is M. Thus, a WL index is in the range 0 to N and a BL index is in the range 0 to M. The variable x may then correspond to a BL index and the variable y may then correspond to a WL index. The first region may then correspond to target memory cells with corresponding WL and BL indices that satisfy the inequality $y<(-N/M)x+N$ and the second region may then correspond to target memory cells with corresponding WL and BL indices that satisfy the inequality $y>(-N/M)x+N$. The memory cells on the region boundary, i.e., line 154, may be included in the first region or the second region. Thus, line 154 corresponds to a region boundary that is related to a combination of WL path length and BL path length. The function may then be used to determine whether a target memory cell is in the first region or the second region.

A number of regions may be constrained by memory array geometry. For example, for a three dimensional cross point memory array, voltage supply traces (i.e., voltage rails) and current sources, e.g., current mirror circuitry, may be configured to fit in a memory array foot print. In other words, a layer of the memory array may include the voltage rails and current mirror(s). For example, a number of regions may be on the range of two to four. In another example, the number of regions may be greater than four.

The number of regions may be further related to memory array geometry. For example, the 3DXP memory array may include a plurality of decks (i.e., layers). The distributed resistance of each WL and/or BL may be similar for a layer but may vary across layers. In this example, a region may correspond to a layer.

Value(s) of one or more control parameter(s) may then be associated with each defined region. Each region may be defined by a range of WL addresses and a range of BL addresses and/or by a function that relates WL addresses and BL addresses. In some embodiments, WL and/or BL addresses may be represented by indices.

A first look up table (LUT) may then be formed that relates WL addresses and BL addresses to region identifiers. For example, the region identifier may correspond to an index. Each index may then be associated with a range of WL addresses and a range of BL addresses and/or a function that relates WL addresses and BL addresses and an inequality indicator. Each region identifier may then be associated with the value(s) of one or more control parameter(s). For example, the region identifier and control parameter values may be included in a second LUT.

For example, control parameters for each region may include a WL and/or BL source voltage value, source current value(s) related to Ihold, set current amplitude Iset and/or reset current amplitude Ireset, and/or time duration value(s) related to set current and/or reset current pulse durations τset, τreset. The number of regions may be defined by ranges of memory cell operational parameters and/or may be constrained by memory array geometry. For example, for two regions, a first region may correspond to a near region and a second region may correspond to a far region. In this example, the terms "near" and "far" are related to electrical distance between supply location and memory cells included in the respective regions. For example, a region boundary between near and far may correspond to line 154.

Thus, control parameter value(s), number of regions and/or region boundaries may be determined a priori. Memory controller 104 may be configured to implement at least some control parameter values, e.g., source voltages and source current(s). For example, memory controller 104 may include a plurality of voltage sources and/or one or more current source(s), as described herein. The number of voltage sources and the number of current sources may be related to the number of regions and/or may be constrained by memory array 106 geometry, as described herein. The control parameter value(s) may thus be associated with one or more regions and/or one or more memory cells. The control parameter value(s), associated region information and/or associated WL and/or BL address ranges may be stored to memory controller 104. Memory controller 104 and/or elements of memory controller 104 may then be configured to utilize the stored information during operation.

Memory controller 104 includes memory controller module 110, WL control module 114 and BL control module 116. Memory controller module 110 is configured to perform operations associated with memory controller 104. For example, memory controller module 110 may manage communications with processor 102 (and peripheral device(s) 103). Memory controller module 110 may be configured to store control parameter value(s), associated region information and/or associated WL and/or BL address ranges ("control information"). For example, memory controller module 110 may be configured to store control information to control information store 113. Memory controller module 110 may be further configured to provide part or all of the control information to WL control module 114 and/or BL control module 116. The control information may be determined and stored a priori and may be provided to the WL control module 114 and BL control module 116 a priori and/or retrieved during operation of system 100.

During operation, memory controller module 110 may be configured to identify one or more target WLs and/or target BL(s) associated with each received memory address. Memory controller module 110 is configured to manage operations of WL control module 114 and BL control module 116 based, at least in part, on the identified target WL(s) and/or target BL(s).

WL control module 114 may include a WL parameter selection module 120 and a control parameter store 121. In some embodiments, WL control module 114 may include a sense module 126. WL control module 114 includes WL driver logic 130, WL control logic 132 and a plurality of switches 140a, . . . , 140n, . . . , 140N, collectively WL switches 140. Switches 140 may include, but are not limited to, switches, transistors (e.g., bipolar junction transistors (BJTs), metal oxide semiconductor field effect transistors (MOSFETs), etc.), etc. In some embodiments, WL parameter selection module 120, WL driver logic 130 and/or WL control logic 132 may be combined into a single module. WL control module 114 is configured to receive target WL address(es) from memory controller module 110 and to select one or more WLs WL0, . . . , WLn, . . . , and/or WLN for reading and/or writing operations. WL control module 114 may be configured to select a target WL by coupling a WL select bias voltage to the target WL.

BL control module 116 may include a BL parameter selection module 124 and a control parameter store 125. BL control module 116 may include the sense module 126. BL control module 116 includes BL driver logic 134, BL control logic 136 and a plurality of switches 142a, . . . , 142m, . . . , 142M, collectively BL switches 142. Switches 142 may include, but are not limited to, switches, transistors (e.g., BJTs, MOSFETs, etc.), etc. In some embodiments, BL parameter selection module 124, BL driver logic 134 and/or BL control logic 136 may be combined into a single module. BL control module 116 is configured to select one or more BLs BL0, . . . , BLm, . . . , and/or BLM for reading and/or writing operations. BL control module 116 may be configured to select one or more target BL(s) BL0, ..., BLm, ..., and/or BLM by coupling a BL select bias voltage to the target BL.

WL control module 114 and BL control module 116 are configured to receive control information from memory control module 110. For example, the control information may be received at or near initial power up of system 100. The control information may then be stored in the control parameter store(s) 121 and/or 125. The stored control information may then be available during operation of system 100.

WL control module 114 is configured to receive a target WL address and BL control module 116 is configured to receive a target BL address from memory controller module 110. The target WL address and target BL address correspond to a memory address related to a memory access operation request from, e.g., processor 102. For example, WL parameter selection module 120 and WL driver logic 130 may be configured to receive the target WL address and BL parameter selection module 124 and BL driver logic 134 may be configured to receive the target BL address. In another example, WL parameter selection module 120 and/or BL parameter selection module 124 may be configured to receive both the target WL address and the target BL address.

WL driver logic 130 and BL driver logic 134 are configured to control switches 140 and 142, respectively, to selectively couple WL control logic 132 to a target WL at a WL supply location and to selectively couple BL control logic 136 to a target BL at a BL supply location. For example, for target memory cell 107, the target WL is WLn and the target BL is BLm. For example, the WL supply location may correspond to a first end 141a of WLn and the BL supply location may correspond to a first end 143a of BLm. In another example, the WL supply location may correspond to intermediate location 141b and the BL supply location may correspond to intermediate location 143b. In this second example, an output port of switch 140n may be coupled to WLn at intermediate location 141b and an output port of switch 142m may be coupled to BLm at intermediate location 143b.

The parameter selection modules 120, 124 are configured to determine and/or select value(s) for one or more control parameter(s) based, at least in part, on the target WL address and/or the target BL address. The parameter selection module(s) 120 and/or 124 may be configured to access control information stored in respective control parameter store(s) 121 and/or 125. The parameter selection module(s) 120 and/or 124 may be configured to identify a region that includes the target memory cell based, at least in part, on the WL address and the BL address and based, at least in part, on region boundaries included in the control parameter store 121, 125. The parameter selection module(s) 120, 124 may be further configured to determine and/or select control parameter value(s) associated with the identified region. One or both parameter selection module(s) 120 and/or 124 may select one or more control parameter value(s). The selected values may each be represented by a respective unique identifier. The selected values and/or corresponding identifiers may then be provided to WL control logic 132 and to BL control logic 136.

WL control logic 132 may be configured to receive a plurality of WL source voltages VWL1, ..., VWLp. In another example, WL control logic 132 may be configured to receive one or more source current(s) I1, ..., Iq. In another example, BL control logic 136 may be configured to receive a plurality of BL source voltages VBL1, ..., VBLr.

The source voltages VWL1, ..., VWLp, VBL1, ..., VBLr and/or source current(s) I1, ..., Iq were determined a priori, as described herein. The numbers of WL source voltages, BL source voltages and source currents may be related to the number of regions, as described herein. In another example, WL control logic 132 may include a timer 133. In this example, WL control logic 132 may be configured to provide a current pulse to a target WL, e.g., WLn for a pulse duration time interval. The pulse duration may be set and/or controlled by timer 133. For example, the pulse duration may be related to programming current pulses, as described herein.

WL control logic 132 may be configured to couple a selected WL source voltage VWL1, ..., or VWLp to a supply location of a target WL via a selected switch, e.g., first end 141a or intermediate location 141b of WLn via switch 140n. BL control logic 136 may be configured to couple a selected BL source voltage VBL1, ..., or VBLr to a supply location of a target BL via a selected switch, e.g., first end 143a or intermediate location 143b of BLm via switch 142m. The source voltages may be selected based, at least in part, on the control parameter value(s) and/or corresponding identifier(s) received from parameter selection module(s) 120 and/or 124. The selected WL source voltage and selected BL source voltage are configured to result in a differential voltage VCELL at a target memory cell, e.g., memory cell 107, that accommodates losses associated with the WL path and BL path to the target memory cell 107. For example, the BL source voltage selected based, at least in part on, the BL address of BLm and the WL source voltage selected, based at least in part, on the WL address of WLn may be configured to provide a VCELL value within a tolerance of the threshold voltage of memory cell 107.

The selected WL source voltage and selected BL source voltage may be coupled to the respective target WL WLn and target BL BLm for a selection time interval. A duration of the selection time interval may be included in control parameter stores(s) 121 and/or 125. The duration of the selection time interval may be related to WL WLn address and/or BL BLm address. The target memory cell 107 may then be read and/or programmed. Reading includes monitoring the target memory cell 107 for presence or absence of snap back during a sensing time interval. A duration of the sensing time interval may be related to WL WLn address and/or to BL BLm address.

WL control logic 132 may be configured to couple a selected current source I1, ..., Iq to a supply location of the target WL via the selected switch. The current source I1, ..., Iq may be selected based, at least in part, on the control parameter value(s) and/or corresponding identifier(s) received from parameter selection module(s) 120 and/or 124. For example, the selected source current may be configured to result in a memory cell current ICELL at target memory cell 107 that accommodates losses associated with the WL path and is related to hold current Ihold determined a priori, for the region that includes target memory cell 107.

Programming a target memory cell includes applying a source current to the supply location 141a or 141b of a selected WL, e.g., WLn, for a time period (i.e., pulse duration), as described herein. The source current amplitude and pulse duration values may be retrieved from control parameter store 121. For example, source current amplitude Iset and duration τset may be configured to result in a current pulse and duration at memory cell 107 sufficient to set memory cell 107. In another example, the source current Ireset and duration τreset may be configured to result in a current pulse at memory cell 107 sufficient to reset memory cell 107.

WL control logic 132 may be configured to couple the selected source current I1, . . . , Iq to the supply location 141a or 141b of a target WL for a pulse duration time interval via a selected switch, e.g., switch 140n. The source current and/or pulse duration time interval may be selected based, at least in part, on the control parameter value(s) and/or corresponding identifier(s) received from parameter selection module(s) 120 and/or 124. The selected source current is configured to result in a current ICELL through a target memory cell, e.g., memory cell 107, that accommodates losses associated with the WL path and BL path to the target memory cell 107. The selected pulse duration is configured to accommodate time constants and/or capacitance associated with the WL path and BL path to the target memory cell 107.

Thus, memory controller 104 may be configured to select one or more control parameter value(s) based, at least in part, on a WL address and/or BL address of a target memory cell in a memory array. The selected control parameter value(s) are configured to accommodate losses and/or time delays related to the WL path and/or BL path associated with the target memory cell. The selected control parameter values may be configured to accommodate variation in memory cell operational parameter(s), for example, Ihold, over the memory array. Energy consumption, memory access latency and/or bit error rate associated with memory access operations may then be reduced for the memory array 106.

Thus, variation in memory cell operational parameter(s) over the memory cell array may be accommodated. For example, selecting reset pulse duration based, at least in part, on location (i.e., WL address and/or BL address) is configured to accommodate variation in RC time constants related to WL path length and/or BL path length. Energy efficiency may be improved, an operational life of memory cells may be increased and/or thermal disturb may be decreased.

In another example, selecting WL and/or BL source voltages based, at least in part, on location is configured to accommodate variation in resistance (and loss) related to WL path length and/or BL path length. Energy efficiency may be improved. Control of memory cell current ICELL may be improved thus reducing impact ionization and/or back conduction from deselected memory cell(s). Current spikes may be reduced thereby reducing a likelihood of damage to one or more peripheral switches (e.g., transistors) coupled to a periphery of the memory cell array.

In another example, selecting WL and/or BL source voltages, source current and/or duration based, at least in part, on location is configured to accommodate variation in memory cell threshold voltage across the memory array (e.g., due to seasoning variation) and/or variation in resistance (and loss) related to WL path length and/or BL path length.

In another example, selecting source current set and/or reset pulse amplitude(s) and/or duration(s) based, at least in part, on location is configured to accommodate seasoning variation. A relationship between memory cell current and memory cell temperature is related to seasoning, thus, seasoning variation may affect this relationship. Thus, selecting source current set and/or reset pulse amplitude(s) and/or duration(s) based, at least in part, on location is configured to achieve a desired target temperature (e.g., for crystal nucleation and/or growth for set or melt for reset). Programming accuracy may thus be improved.

Figure 2:
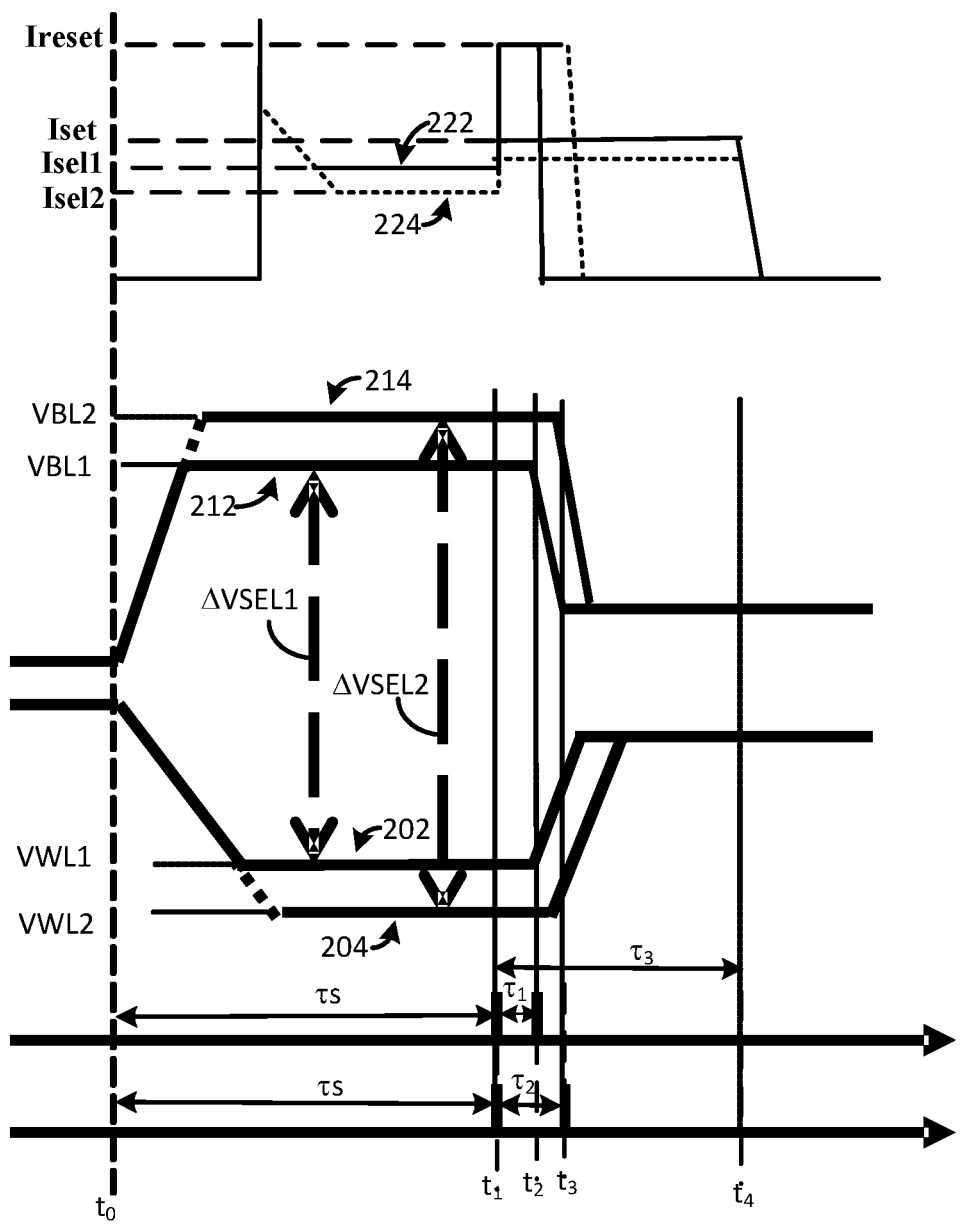
FIG. 2 illustrates example timing diagrams for memory access operations consistent with one embodiment of the present disclosure.

FIG. 2 illustrates example 200 timing diagrams for memory access operations consistent with one embodiment of the present disclosure. Example 200 includes a first WL source voltage waveform 202 and a second source voltage waveform 204, a first BL source voltage waveform 212 and a second BL source voltage waveform 214. Example 200 further includes a first current waveform 222 and a second current waveform 224. The waveforms are functions of time. The voltage and current waveforms are related to selecting a memory cell, e.g., memory cell 107, and performing a memory access operation on the selected memory cell 107.

In this example 200, waveforms 202, 212 and 222 correspond to a first region of memory cells located relatively nearer to a supply location of respective BLs and/or WLs and waveforms 204, 214 and 224 correspond to a second region of memory cells located relatively more distant from the supply location of respective BLs and/or WLs. First source voltage waveforms 202 and 212 are configured to select a target memory cell included in the first region and second source voltage waveforms 204 and 214 are configured to select a target memory cell included in the second region. A first differential source voltage ΔNSEL1 corresponds to a difference between voltages VBL1 and VWL1 that are the source voltage values associated with waveforms 202 and 212, respectively. A second differential source voltage ΔNSEL2 corresponds to a difference between voltages VBL2 and VWL2 that are the source voltage values associated with waveforms 204 and 214, respectively. ΔNSEL2 is greater than ΔNSEL1 and is configured to accommodate relatively greater losses in a WL path and/or a BL path included in the second region compared to the first region. A lesser ΔNSEL1 may result in relatively fewer false selections (i.e., selection of non-target memory cells) in the first region. A differential cell bias voltage VCELL for a target memory cell included in the first region may be approximately equal to a differential bias voltage for a target memory cell included in the second region.

The first source current waveform 222 and the second source current waveform 224 illustrate source current pulse amplitudes related to selecting and holding a memory cell and programming the memory cell. The pulse amplitudes Isel1, Isel2 are related to respective hold current pulse amplitudes for target memory cells included in the first region or the second region, respectively. In this example, a hold current Ihold1 for the first region is greater than a hold current Ihold2 for the second region, thus, Isel1 is greater than Ise12. Isel1 and Isel2 are configured to achieve memory cell currents greater than or equal to Ihold1 and/or Ihold2 in the first and second regions, respectively. Isel1 and Isel2 may be determined and stored a priori, as described herein.

Iset corresponds to a current source set pulse amplitude and Ireset corresponds to a current source reset pulse amplitude. Iset may or may not be the same for the two regions. Similarly, Ireset may or may not be the same for the two regions. Programming pulse duration(s) may differ between the two regions. The values of Iset and Ireset may be determined a priori, as described herein.

Example 200 further illustrates a first programming pulse duration τ1, a second programming pulse duration τ2 and a third programming pulse duration τ3. The first and second programming pulse durations τ1, τ2 correspond to source reset current pulse durations for the first region and the second region, respectively. The second programming pulse duration τ3 corresponds to a source set current pulse duration for the first and second regions. The pulse durations may be determined a priori, as described herein.

At time t0, a WL source voltage and a BL source voltage are applied to respective source locations of the target WL and target BL. At time t1, the target memory cell has been selected and a selected programming current is applied to the supply location of the target WL. A duration of the time interval between t0 and t1 corresponds to a selection time interval TS. During the selection time interval τs, Isel1 or Isel2 may be applied to the supply location of the target WL configured to achieve a target memory cell current at or above Ihold for the region that includes the target memory cell. At time t2, corresponding to completion of the first programming pulse duration τ1, programming of a target memory cell included in the first region may be complete and the Ireset current source may be decoupled from the target WL. At time t3, corresponding to completion of the second programming pulse duration τ2, programming of a target memory cell included in the second region may be complete and the Ireset current source may be decoupled from the target WL. At time τ4, corresponding to completion of the third programming pulse duration τ3, programming of a target memory cell may be completed and the Iset current source may be decoupled from the target WL.

Thus, example 200 illustrates source selection bias voltages, selection currents, programming currents and programming pulse durations for two regions of memory cells. The source selection bias voltages, programming currents and programming pulse durations are configured to accommodate unequal losses and unequal time constants associated with the respective WL paths and BL paths of the two regions. The selection currents are configured to accommodate Ihold for the first (e.g., near) region less than Ihold for the second (e.g., far) region.

Thus, an apparatus, system and method are configured to select a value of at least one control parameter based, at least in part, on an address associated with a target memory cell in a cross point memory, e.g., a 3DXP technology. Value(s) of each control parameter may be determined prior to operation and selected during operation or may be determined and selected during operation. Selecting control parameter value(s) based, at least in part, on a target WL address and/or a target BL address associated with the target memory cell is configured to accommodate variation in effective impedance with path length and/or variation in memory cell operational parameter(s), e.g., Ihold, with location, as described herein.

Figure 3:
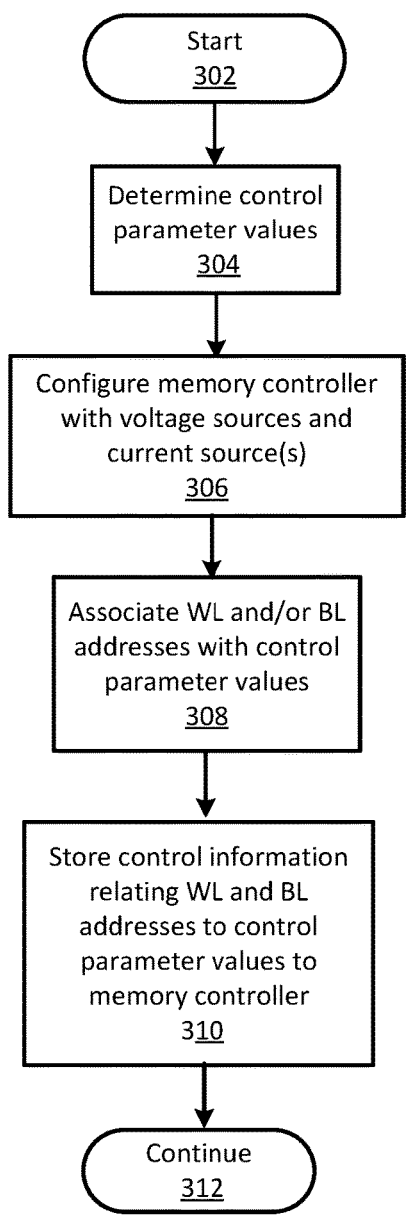
FIG. 3 illustrates a flowchart of operations for determining control information for a memory cell array consistent with various embodiments of the present disclosure.

FIG. 3 illustrates a flowchart 300 of operations for determining control information for a memory cell array consistent with various embodiments of the present disclosure. The operations may be performed, for example, by a peripheral device(s) 103, processor 102 and/or memory controller 104. Flowchart 300 depicts exemplary operations configured to determine and store control information related to a memory array, e.g., memory array 106. In particular, flowchart 300 depicts exemplary operations configured to determine control parameter values as a function of WL and/or BL path length, to relate the control parameter values to WL and/or BL address(es) and to store the control information, as described herein.

Operations of flowchart 300 may begin with start at operation 302. Control parameter values may be determined at operation 304. For example, control parameter values may be determined experimentally and/or may be set by, for example, a user. A memory controller, e.g., memory controller 104, may be configured with voltage sources and current source(s) at operation 306. The voltage sources and current source(s) may be related to the control parameter value(s). One or more WL and/or BL addresses may be associated with control parameter values at operation 308. Control information relating WL and BL addresses to control parameter values may be stored to a memory controller, e.g., memory controller 104, at operation 310. Program flow may then continue at operation 312.

Thus, the operations of flowchart 300 are configured to select and/or determine one or more control parameter value(s), associate the control parameter value(s) to one or more WL and/or BL addresses and to store the control information to a memory controller.

Figure 4:
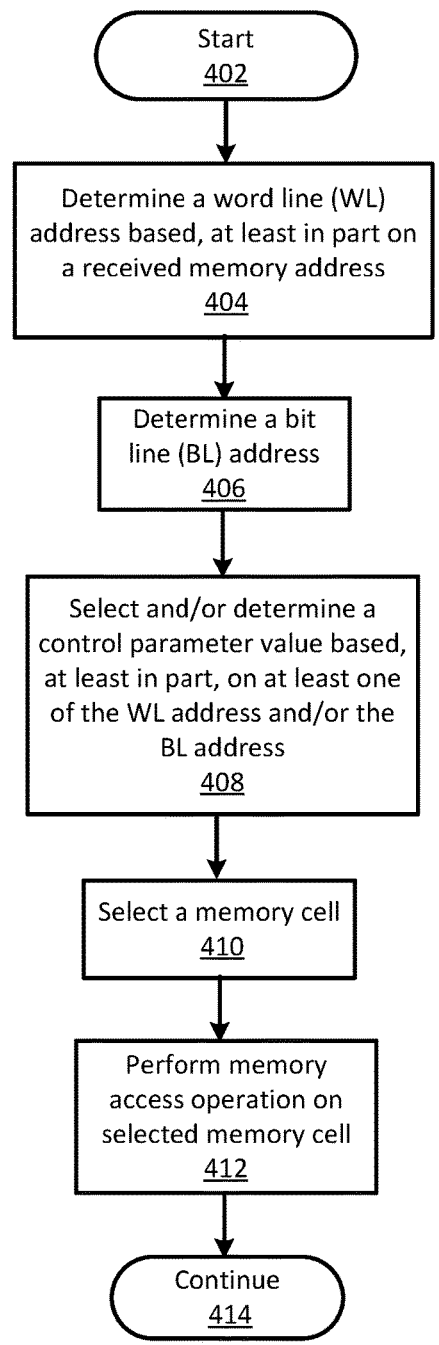
FIG. 4 illustrates a flowchart of operations for selecting control parameter value(s) for a memory cell consistent with various embodiments of the present disclosure.

FIG. 4 illustrates a flowchart 400 of operations for selecting control parameter value(s) for a memory cell consistent with various embodiments of the present disclosure. The operations may be performed, for example, by a memory controller, e.g., memory controller 104, including WL control module 114, BL control module 116, WL parameter selection module 120 and/or BL parameter selection module 124. Flowchart 400 depicts exemplary operations configured to select a control parameter value based, at least in part, on a location of a target memory cell in a memory cell array. In particular, flowchart 400 depicts exemplary operations configured to select a control parameter value based at least in part, on a WL address and/or a BL address for a memory access operation, as described herein.

Operations of flowchart 400 may begin with start at operation 402. A WL address may be determined based, at least in part, on a received memory address at operation 404. A BL address may be determined at operation 406. A control parameter value may be selected and/or determined based, at least in part, on at least one of the WL address and/or the BL address at operation 408. For example, the control parameter value may be selected using a LUT. A memory cell may be selected at operation 410. For example, the memory cell may be selected based, at least in part, on the WL address and/or the BL address. A memory access operation may be performed on the selected memory cell at operation 412. Program flow may then continue at operation 414.

Thus, the operations of flowchart 400 are configured to select and/or determine one or more control parameter value(s) based, at least in part, on a WL and/or BL address, to select a memory cell for memory access operation(s), e.g., reading and/or programming, and to perform the memory access operation(s) using the selected control parameter value(s). Thus, variation in WL and/or BL path impedances and/or memory cell operational parameters (e.g., Ihold) may be accommodated.

While FIGS. 3 and 4 illustrate various operations according one embodiment, it is to be understood that not all of the operations depicted in FIGS. 3 and/or 4 are necessary for other embodiments. Indeed, it is fully contemplated herein that in other embodiments of the present disclosure, the operations depicted in FIGS. 3 and/or 4 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" and/or the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic and/or module may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various modules and/or circuitry described herein. For example, in one embodiment the hardware description language may comply or be compatible with a very high speed integrated circuits (VHSIC) hardware description language (VHDL) that may enable semiconductor fabrication of one or more circuits and/or modules described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Control information store 113, control parameter store 121 and/or control parameter store 125 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

Thus, an apparatus, system and method are configured to select a value of at least one control parameter based, at least in part, on an address associated with a target memory cell in a cross point memory, e.g., a 3DXP technology. Value(s) of each control parameter may be determined prior to operation and selected during operation or may be determined and selected during operation. Selecting control parameter value(s) based, at least in part, on a target WL address and/or a target BL address associated with the target memory cell is configured to accommodate variation in effective impedance with path length and/or variation in memory cell operational parameter(s), e.g., Ihold, with location, as described herein.

EXAMPLES

Examples of the present disclosure include subject material such as a method, means for performing acts of the method, a device, or of an apparatus or system related to selecting and/or determining a value of a control parameter associated with a memory cell, as discussed below.

Example 1

According to this example, there is provided an apparatus. The apparatus includes a memory controller. The memory controller includes a word line (WL) control module and a bit line (BL) control module. The memory controller is to determine a WL address based, at least in part, on a received memory address. The memory controller is further to determine a BL address. The example further includes a parameter selection module to select a value of a control parameter based, at least in part, on at least one of the WL address and/or the BL address.

Example 2

This example includes the elements of example 1, wherein the control parameter is related to at least one of selecting and/or performing a memory access operation on a target memory cell.

Example 3

This example includes the elements of example 1, wherein the control parameter is selected from a group including a source voltage, a source current amplitude, a selection time interval duration, a sensing time interval duration and a source pulse duration.

Example 4

This example includes the elements of example 1, wherein the selected value is associated with at least one of a range of WL addresses and/or a range of BL addresses.

Example 5

This example includes the elements according to any one of examples 1 through 4, wherein the memory controller further includes a control information store.

Example 6

This example includes the elements of example 5, wherein the control information store stores control information including at least one value for each of a first plurality of control parameters and at least one of associated region information, an associated WL address range and/or an associated BL address range.

Example 7

This example includes the elements according to any one of examples 1 through 4, wherein at least one of the WL control module and/or the BL control module includes a control parameter store to store at least one value for each of a second plurality of control parameters.

Example 8

This example includes the elements of example 7, wherein the control parameter store includes a look up table.

Example 9

This example includes the elements according to any one of examples 1 through 4, wherein the selected value is related to an effective impedance associated with at least one of the WL address and the BL address.

Example 10

This example includes the elements according to any one of examples 1 through 4, wherein the selected value is related to at least one of a WL path length associated with the BL address and/or a BL path length associated with the WL address.

Example 11

This example includes the elements of example 10, wherein the selected value is related to at least one of an effective resistance and/or a time constant related to the WL path length.

Example 12

This example includes the elements of example 10, wherein the selected value is related to at least one of an effective resistance and/or a time constant related to the BL path length.

Example 13

This example includes the elements according to any one of examples 1 through 4, wherein the selected value is related to a variation in at least one operational parameter.

Example 14

This example includes the elements of example 13, wherein the at least one operational parameter is selected from the group including a memory cell selection threshold voltage, a hold current amplitude, a set programming current amplitude, a reset programming current amplitude, a set programming pulse duration and reset programming pulse duration.

Example 15

This example includes the elements of example 3, wherein the source current amplitude corresponds to at least one of a hold current, a reset programming current and/or a set programming current.

Example 16

This example includes the elements of example 3, wherein the source pulse duration corresponds to a reset pulse duration or a set pulse duration.

Example 17

This example includes the elements according to any one of examples 1 through 4, wherein the selected value is related to a region of a memory cell array.

Example 18

This example includes the elements according to any one of examples 1 through 4, wherein the WL control module is to controllably couple at least one of a source voltage and/or a source current to a WL supply location.

Example 19

This example includes the elements according to any one of examples 1 through 4, wherein the BL control module is to controllably couple a source voltage to a BL supply location.

Example 20

This example includes the elements according to any one of examples 1 through 4, wherein the WL control module includes a timer, the timer to set a pulse duration.

Example 21

This example includes the elements according to any one of examples 1 through 4, wherein the WL control module includes a plurality of voltage sources.

Example 22

This example includes the elements of example 21, wherein the WL control module further includes at least one current source.

Example 23

This example includes the elements according to any one of examples 1 through 4, wherein the BL control module includes a plurality of voltage sources.

Example 24

This example includes the elements according to any one of examples 1 through 4, wherein the parameter selection module is a BL parameter selection module and the control parameter is a BL source voltage.

Example 25

This example includes the elements according to any one of examples 1 through 4, wherein the parameter selection module is a WL parameter selection module and the control parameter is a WL source voltage.

Example 26

This example includes the elements according to any one of examples 1 through 4, wherein the parameter selection module is a WL parameter selection module and the control parameter is a source current.

Example 27

According to this example there is provided a method. The method includes determining, by a memory controller, a word line (WL) address based, at least in part, on a received memory address; determining, by the memory controller, a bit line (BL) address; and selecting, by a parameter selection module, a value of a control parameter based, at least in part, on at least one of the WL address and/or the BL address.

Example 28

This example includes the elements of example 27, wherein the control parameter is related to at least one of selecting and/or performing a memory access operation on a target memory cell.

Example 29

This example includes the elements of example 27, wherein the control parameter is selected from a group including a source voltage, a source current amplitude, a selection time interval duration, a sensing time interval duration and a source pulse duration.

Example 30

This example includes the elements of example 27, wherein the selected value is associated with at least one of a range of WL addresses and/or a range of BL addresses.

Example 31

This example includes the elements of example 27, and further includes storing, by a control information store, control information.

Example 32

This example includes the elements of example 31, wherein the control information includes at least one value for each of a first plurality of control parameters and at least one of associated region information, an associated WL address range and/or an associated BL address range.

Example 33

This example includes the elements of example 27, and further includes storing, by at least one of a WL control module and/or a BL control module, at least one value for each of a second plurality of control parameters to a control parameter store.

Example 34

This example includes the elements of example 33, wherein the control parameter store includes a look up table.

Example 35

This example includes the elements of example 27, wherein the selected value is related to an effective impedance associated with at least one of the WL address and the BL address.

Example 36

This example includes the elements of example 27, wherein the selected value is related to at least one of a WL path length associated with the BL address and/or a BL path length associated with the WL address.

Example 37

This example includes the elements of example 36, wherein the selected value is related to at least one of an effective resistance and/or a time constant related to the WL path length.

Example 38

This example includes the elements of example 36, wherein the selected value is related to at least one of an effective resistance and/or a time constant related to the BL path length.

Example 39

This example includes the elements of example 27, wherein the selected value is related to a variation in at least one operational parameter.

Example 40

This example includes the elements of example 39, wherein the at least one operational parameter is selected from the group including a memory cell selection threshold voltage, a hold current amplitude, a set programming current amplitude, a reset programming current amplitude, a set programming pulse duration and reset programming pulse duration.

Example 41

This example includes the elements of example 29, wherein the source current amplitude corresponds to at least one of a hold current, a reset programming current and/or a set programming current.

Example 42

This example includes the elements of example 29, wherein the source pulse duration corresponds to a reset pulse duration or a set pulse duration.

Example 43

This example includes the elements of example 27, wherein the selected value is related to a region of a memory cell array.

Example 44

This example includes the elements of example 27, and further includes controllably coupling, by the WL control module, at least one of a source voltage and/or a source current to a WL supply location.

Example 45

This example includes the elements of example 27, and further includes controllably coupling, by the BL control module, a source voltage to a BL supply location.

Example 46

This example includes the elements of example 27, and further includes setting, by a timer, a pulse duration.

Example 47

This example includes the elements of example 27, wherein the WL control module includes a plurality of voltage sources.

Example 48

This example includes the elements of example 47, wherein the WL control module further includes at least one current source.

Example 49

This example includes the elements of example 27, wherein the BL control module includes a plurality of voltage sources.

Example 50

This example includes the elements of example 27, wherein the parameter selection module is a BL parameter selection module and the control parameter is a BL source voltage.

Example 51

This example includes the elements of example 27, wherein the parameter selection module is a WL parameter selection module and the control parameter is a WL source voltage.

Example 52

This example includes the elements of example 27, wherein the parameter selection module is a WL parameter selection module and the control parameter is a source current.

Example 53

According to this example there is provided a system. The system includes a processor; a cross-point memory array and a memory controller. The cross-point memory array includes a memory cell, a word line (WL) and a bit line (BL). The memory cell is coupled between the word line and the bit line. The memory controller includes a WL control module; a BL control module; and a parameter selection module. The memory controller is to determine a WL address based, at least in part, on a received memory address. The memory controller is further to determine a BL address. The parameter selection module is to select a value of a control parameter based, at least in part, on at least one of the WL address and/or the BL address.

Example 54

This example includes the elements of example 53, wherein the control parameter is related to at least one of selecting and/or performing a memory access operation on the memory cell.

Example 55

This example includes the elements of example 53, wherein the control parameter is selected from a group including a source voltage, a source current amplitude, a selection time interval duration, a sensing time interval duration and a source pulse duration.

Example 56

This example includes the elements of example 53, wherein the selected value is associated with at least one of a range of WL addresses and/or a range of BL addresses.

Example 57

This example includes the elements according to any one of examples 53 through 56, wherein the memory controller further includes a control information store.

Example 58

This example includes the elements of example 57, wherein the control information store stores control information including at least one value for each of a first plurality of control parameters and at least one of associated region information, an associated WL address range and/or an associated BL address range.

Example 59

This example includes the elements according to any one of examples 53 through 56, wherein at least one of the WL control module and/or the BL control module includes a control parameter store to store at least one value for each of a second plurality of control parameters.

Example 60

This example includes the elements of example 59, wherein the control parameter store includes a look up table.

Example 61

This example includes the elements according to any one of examples 53 through 56, wherein the selected value is related to an effective impedance associated with at least one of the WL address and the BL address.

Example 62

This example includes the elements according to any one of examples 53 through 56, wherein the selected value is related to at least one of a WL path length associated with the
BL address and/or a BL path length associated with the WL address.

Example 63

This example includes the elements of example 62, wherein the selected value is related to at least one of an effective resistance and/or a time constant related to the WL path length.

Example 64

This example includes the elements of example 62, wherein the selected value is related to at least one of an effective resistance and/or a time constant related to the BL path length.

Example 65

This example includes the elements of example 62, wherein the WL path length corresponds to a distance between a WL supply location and the memory cell.

Example 66

This example includes the elements of example 62, wherein the BL path length corresponds to a distance between a BL supply location and the memory cell.

Example 67

This example includes the elements according to any one of examples 53 through 56, wherein the selected value is related to a variation in at least one operational parameter.

Example 68

This example includes the elements of example 67, wherein the at least one operational parameter is selected from the group including a memory cell selection threshold voltage, a hold current amplitude, a set programming current amplitude, a reset programming current amplitude, a set programming pulse duration and reset programming pulse duration.

Example 69

This example includes the elements of example 55, wherein the source current amplitude corresponds to at least one of a hold current, a reset programming current and/or a set programming current.

Example 70

This example includes the elements of example 55, wherein the source pulse duration corresponds to a reset pulse duration or a set pulse duration.

Example 71

This example includes the elements according to any one of examples 53 through 56, wherein the selected value is related to a region of a memory cell array.

Example 72

This example includes the elements according to any one of examples 53 through 56, wherein the memory array includes a plurality of regions.

Example 73

This example includes the elements of example 72, wherein a number of regions is two.

Example 74

This example includes the elements of example 72, wherein a number of regions is in the range of two to four.

Example 75

This example includes the elements of example 72, wherein a number of regions is related to at least one memory cell operational parameter.

Example 76

This example includes the elements of example 72, wherein a number of regions is related to a size of the memory array.

Example 77

This example includes the elements of example 72, wherein a number of regions is related to at least one of a number of voltage sources and/or a number of current sources included in the memory controller.

Example 78

This example includes the elements of example 72, wherein each region is defined by a range of WL addresses and a range of BL addresses.

Example 79

This example includes the elements of example 72, wherein a number of regions is two and the two regions are bounded by a line relating a range of WL addresses to a range of BL addresses.

Example 80

This example includes the elements according to any one of examples 53 through 56, wherein the WL control module is to controllably couple at least one of a source voltage and/or a source current to a WL supply location.

Example 81

This example includes the elements of example 80, wherein the WL supply location corresponds to a first end of the WL.

Example 82

This example includes the elements of example 80, wherein the WL supply location corresponds to an intermediate location along the WL.

Example 83

This example includes the elements of example 80, wherein the intermediate location corresponds to a center location of the WL.

Example 84

This example includes the elements according to any one of examples 53 through 56, wherein the BL control module is to controllably couple a source voltage to a BL supply location.

Example 85

This example includes the elements of example 84, wherein the BL supply location corresponds to a first end of the BL.

Example 86

This example includes the elements of example 84, wherein the BL supply location corresponds to an intermediate location along the BL.

Example 87

This example includes the elements of example 84, wherein the intermediate location corresponds to a center location of the BL.

Example 88

This example includes the elements according to any one of examples 53 through 56, wherein the WL control module includes a timer, the timer to set a pulse duration.

Example 89

This example includes the elements according to any one of examples 53 through 56, wherein the WL control module includes a plurality of voltage sources.

Example 90

This example includes the elements of example 89, wherein the WL control module further includes at least one current source.

Example 91

This example includes the elements according to any one of examples 53 through 56, wherein the BL control module includes a plurality of voltage sources.

Example 92

This example includes the elements according to any one of examples 53 through 56, wherein the parameter selection module is a BL parameter selection module and the control parameter is a BL source voltage.

Example 93

This example includes the elements according to any one of examples 53 through 56, wherein the parameter selection module is a WL parameter selection module and the control parameter is a WL source voltage.

Example 94

This example includes the elements according to any one of examples 53 through 56, wherein the parameter selection module is a WL parameter selection module and the control parameter is a source current.

Example 95

According to this example, there is provided a system. The system includes at least one device arranged to perform the example of any one of examples 27 to 52.

Example 96

According to this example, there is provided a device. The device includes means to perform the example of any one of examples 27 to 52.

Example 97

A computer readable storage device having stored thereon instructions that when executed by one or more processors result in the following operations including: the method according to any one of examples 27 to 52.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
   an interface to connect with one or more memory devices based at least, in part, on connection of the one or more memory devices with the interface;
   a control parameter store to store at least one control parameter;
   a controller communicatively coupled to the interface, the controller to:
     receive a request to access one or more memory cells of at least one of the one or more memory devices;
     determine a region location associated with the one or more memory cells; and
     provide the at least one control parameter for at least one control signal based, at least in part, on the region location, wherein:
       the at least one control parameter comprises a signal amplitude value and a signal time duration and
       the at least one control signal comprises one or more of: a set signal and a reset signal;
   a word line controller; and
   a bit line controller, wherein:
     the word line controller is to provide at least one signal to the one or more memory cells,
     the bit line controller is to provide at least one signal to the one or more memory cells, and
     the region location is based at least, in part, on a distance A of the word line controller from the one or more memory cells and the region location is also based at least, in part, on a distance B of the bit line controller logic from the one or more memory cells, wherein the distance A and distance B are the same or different.

2. The apparatus of claim 1, wherein to access the one or more memory cells comprises a selection, read or write of the one or more memory cells.

3. The apparatus of claim 1, wherein the set signal is used at least to program one or more memory cells to maintain a logic one and the reset signal is used at least to program one or more memory cells to maintain a logic zero.

4. The apparatus of claim 1, wherein the at least one control signal is used for selection of the one or more memory cells.

5. The apparatus of claim 1, wherein the set signal comprises a set current and the reset signal comprises a reset current.

6. The apparatus of claim 1, wherein the at least one control signal comprises one or more of: a word line (WL) voltage signal or a bit line (BL) voltage signal.

7. The apparatus of claim 6, wherein the WL voltage signal is to cause selection of a row of one or more memory cells and wherein the BL voltage signal is to cause selection of a column of one or more memory cells.

8. The apparatus of claim 1, wherein the region location comprises a tile position in an array of memory cells.

9. The apparatus of claim 1, wherein the region location is associated with at least one word line and at least one bit line.

10. The apparatus of claim 1, wherein to provide at least one control parameter for at least one control signal based, at least in part, on the region location, the controller is to provide at least one control parameter for at least one control signal based, at least in part, on one or more of: the distance A and the distance B.

11. The apparatus of claim 1, further comprising the one or more memory devices connected to the interface.

12. The apparatus of claim 11, wherein the one or more memory devices comprise one or more of: a non-volatile memory and a random access memory (RAM) and wherein the non-volatile memory comprises one or more of: three dimensional cross point memory and phase change memory.

13. A method comprising:
receiving, by a controller, a request to access one or more memory cells of at least one memory device;
determining, by the controller, a region location associated with the one or more memory cells; and
providing, from a storage device that stores at least one control parameter, the at least one control parameter for at least one control signal based, at least in part, on the region location, wherein:
the at least one control parameter comprises a signal amplitude value and a signal time duration;
the at least one control signal comprises one or more of: a set signal and a reset signal, and
the region location is based at least, in part, on a distance A of a word line controller from the one or more memory cells and the region location is also based at least, in part, on a distance B of the bit line controller from the one or more memory cells, wherein the distance A and distance B are the same or different.

14. The method of claim 13, wherein access the one or more memory cells comprises a selection, read or write of the one or more memory cells.

15. The method of claim 13, wherein the set signal is used at least to program one or more memory cells to maintain a logic one and the reset signal is used at least to program one or more memory cells to maintain a logic zero.

16. The method of claim 13, wherein the at least one control signal is used for selection of the one or more memory cells.

17. The method of claim 13, wherein the set signal comprises a set current and the reset signal comprises a reset current.

18. The method of claim 13, wherein the at least one control signal comprises one or more of: a word line (WL) voltage signal or a bit line (BL) voltage signal.

19. The method of claim 13, wherein the region location comprises a tile position in an array of memory cells and the region location is associated with at least one word line and at least one bit line.

20. The method of claim 13, wherein the one or more memory devices comprise one or more of: a non-volatile memory and a random access memory (RAM) and wherein the non-volatile memory comprises one or more of: three dimensional cross point memory and phase change memory.

21. At least one non-transitory computer-readable medium, comprising instructions stored thereon, that if executed by one or more processors, cause the one or more processors to:

receive, by a controller, a request to access one or more memory cells of at least one of the one or more memory devices;
determine, by the controller, a region location associated with the one or more memory cells; and
provide, from a storage device that stores at least one control parameter, the at least one control parameter for at least one control signal based, at least in part, on the region location, wherein:
the at least one control parameter comprises a signal amplitude value and a signal time duration;
the at least one control signal comprises one or more of: a set signal and a reset signal, and
the region location is based at least, in part, on a distance A of a word line controller from the one or more memory cells and the region location is also based at least, in part, on a distance B of the bit line controller from the one or more memory cells, wherein the distance A and distance B are the same or different.

22. The at least one non-transitory computer-readable medium of claim 21, wherein access the one or more memory cells comprises a selection, read or write of the one or more memory cells.

23. The at least one non-transitory computer-readable medium of claim 21, wherein the set signal is used at least to program one or more memory cells to maintain a logic one and the reset signal is used at least to program one or more memory cells to maintain a logic zero.

24. The at least one non-transitory computer-readable medium of claim 21, wherein the at least one control signal is used for selection of the one or more memory cells.

25. The at least one non-transitory computer-readable medium of claim 21, wherein the set signal comprises a set current and the reset signal comprises a reset current.

26. The at least one non-transitory computer-readable medium of claim 21, wherein the at least one control signal comprises one or more of: a word line (WL) voltage signal or a bit line (BL) voltage signal.

27. The at least one non-transitory computer-readable medium of claim 21, wherein the region location comprises a tile position in an array of memory cells and the region location is associated with at least one word line and at least one bit line.

28. A system comprising:
one or more processors;
one or more memory devices;
a controller communicatively coupled to the one or more processors and the one or more memory devices, the controller to:
receive a request to access one or more memory cells of at least one of the one or more memory devices;
determine a region location associated with the one or more memory cells; and
provide, from a storage device that stores at least one control parameter, the at least one control parameter for at least one control signal based, at least in part, on the region location, wherein:
the at least one control parameter comprises a signal amplitude value and a signal time duration;
the at least one control signal comprises one or more of: a set signal and a reset signal, and
the region location is based at least, in part, on a distance A of a word line control logic from the one or more memory cells and the region location is also based at least, in part, on a distance B of the bit line controller from the one or more memory cells, wherein the distance A and distance B are the same or different.

29. The system of claim 28, wherein the access one or more memory cells comprises a selection, read or write of the one or more memory cells.

30. The system of claim 28, wherein the set signal is used at least to program one or more memory cells to maintain a logic one and the reset signal is used at least to program one or more memory cells to maintain a logic zero.

31. The system of claim 28, wherein the at least one control signal is used for selection of the one or more memory cells.

32. The system of claim 28, wherein the set signal comprises a set current and wherein reset signal comprises a reset current.

33. The system of claim 28, wherein the at least one control signal comprises one or more of: a word line (WL) voltage signal or a bit line (BL) voltage signal.

34. The system of claim 28, wherein the region location comprises a tile position in an array of memory cells and the region location is associated with at least one word line and at least one bit line.

35. The system of claim 28, wherein the one or more memory devices comprise one or more of: a non-volatile memory and a random access memory (RAM) and wherein the non-volatile memory comprises one or more of: three dimensional cross point memory and phase change memory.

36. The system of claim 28, further comprising one or more of:

a display communicatively coupled to the one or more processors, a network interface communicatively coupled to the one or more processors, and a touch screen interface communicatively coupled to the one or more processors.

* * * * *